United States Patent [19]

Batinovich

[11] 4,451,972
[45] Jun. 5, 1984

[54] METHOD OF MAKING ELECTRONIC CHIP WITH METALIZED BACK INCLUDING A SURFACE STRATUM OF SOLDER

[75] Inventor: Victor A. Batinovich, Los Altos, Calif.

[73] Assignee: National Semiconductor Corporation, Santa Clara, Calif.

[21] Appl. No.: 367,785

[22] Filed: Apr. 12, 1982

Related U.S. Application Data

[62] Division of Ser. No. 113,805, Jan. 21, 1980.

[51] Int. Cl.³ ............................................. H01L 21/92
[52] U.S. Cl. .................................... 29/583; 29/576 S;
   29/590; 29/591; 357/71; 427/89; 428/642;
   428/643; 428/656; 428/661; 428/673; 428/680
[58] Field of Search ...................... 29/576 S, 583, 589,
   29/590, 591, 580; 357/70, 71, 81; 427/89, 91;
   428/630, 642, 643, 656, 661, 673, 680, 686

[56] References Cited

U.S. PATENT DOCUMENTS 3,046,176  7/1962  Bosenberg ........................ 29/590 X
4,321,617  3/1982  Duda et al. ........................... 357/71
4,360,142  11/1982  Carpenter et al. .................. 228/123

Primary Examiner—Brian E. Hearn
Assistant Examiner—Alan E. Schiavelli
Attorney, Agent, or Firm—Brown & Martin

[57] ABSTRACT

Electronic chip having a composite stratified metal back and method of making it in which strata of metal and/or metal alloys are deposited on the back of the silicon base or a wafer carrying a plurality of circuit components on its face at least one of the strata being resistant to passage of copper at attaching and operational temperatures, and a stratum of solder is provided on the surface of the previously deposited strata for joining the chip to a lead frame.

11 Claims, 5 Drawing Figures

METHOD OF MAKING ELECTRONIC CHIP WITH METALIZED BACK INCLUDING A SURFACE STRATUM OF SOLDER

This is a divisional of application Ser. No. 113,805, filed Jan. 21, 1980.

FIELD OF THE INVENTION

This invention relates to electronic chips with metallized backing for attachment to lead frames and to methods of making such chips.

BACKGROUND OF THE INVENTION

In the fabrication of chips used in electronic circuitry, a first step is the preparation of a wafer in which a large number, often as many as 10,000 of circuit elements are formed on a thin silicon disk. The wafer is then divided into individual chips and the chips are secured to a supporting surface known as a lead frame.

It has been the practice to use a very thin layer of gold as an adhesive to secure the chips to the lead frame which may also carry a thin layer of gold. Because of the soft and oxide-free surface of gold, satisfactory joining has been possible by use of mild pressure and slight relative motion called "scrubbing" between surfaces to be joined.

The tremendous increase in the price of gold has made the use of gold for adhering chips to a supporting surface excessively expensive and substitution of other metals has been tried. However, joining by the procedures useful with gold has not been satisfactory for use with other metals.

Efforts to coat the supporting surface with solder, lay the chips on the coating and complete the union by melting then cooling the solder have not been successful. A serious problem with this procedure is the prevalence of voids between the chip and the solder which interferes with dissipation of heat from the chip to the supporting surface and leads to early failure of the chip circuit. Additionally, copper from the lead frame may be taken up by the solder and passed through the silicon layer into an electronic component such as a transistor to alter its characteristics.

OBJECT OF THE INVENTION

It is an object of the present invention to provide an electronic chip and method for making such chips capable of being secured to a supporting surface using a metal backing other than gold.

BRIEF STATEMENT OF THE INVENTION

I have found that a composite metallized back including a surface stratum of solder may be secured to a wafer and the wafer separated into solder bearing chips by depositing on the wafer a series of different metals forming a successive strata of which only the exposed surface metal is solder. By using as one metal stratum a metal resistant to the passage of copper, chips divided from the wafer may be secured to a lead frame by laying them on the frame and heating to cause the solder layer to adhere to the lead frame without danger of contamination of the circuit element.

DRAWINGS

The invention will be described in connection with the attached drawings in which.

DETAILED DESCRIPTION OF THE INVENTION

In the method of the present invention, a novel composite metal back including a surface of tin or lead solder is formed on a silicon wafer carrying a plurality of electronic elements on its face through deposition of selected metals and/or alloys successively in an order effective for securing chips severed from the wafer in excellent heat tranfer relation to a lead frame and to protect electronic elements on the chips from contamination by elements such as copper present in the lead frame.

Figure 1:
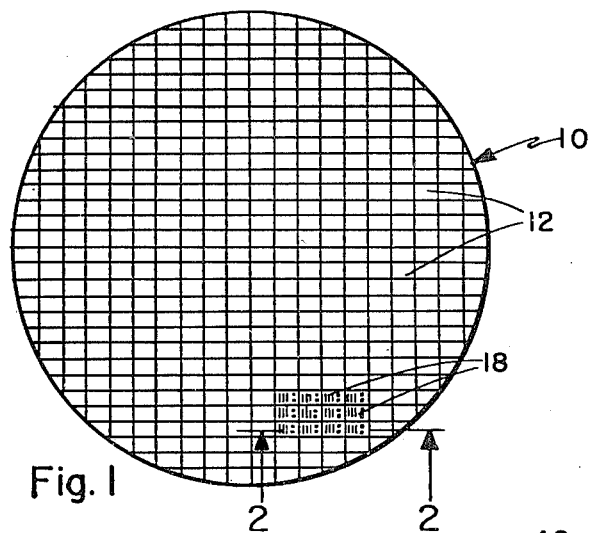
FIG. 1 is a plan view of a wafer with electronic circuit elements indicated on its face.
Figure 2:
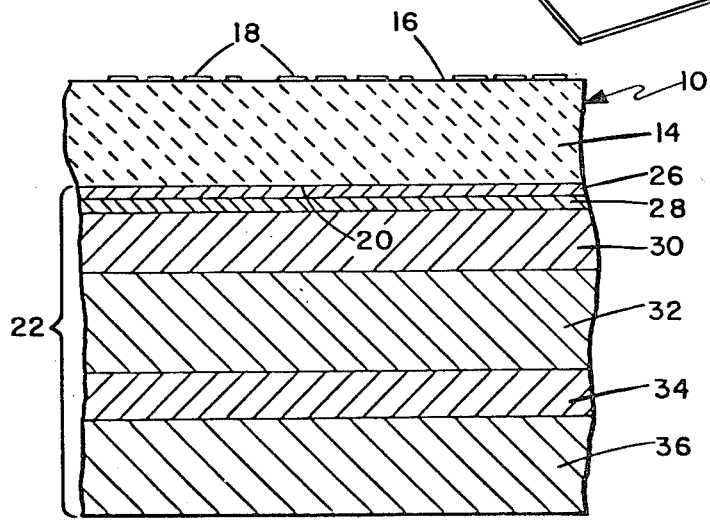
FIG. 2 is a fractional, sectional view, with parts enlarged for clarity, taken on the line 2—2 of FIG. 1.

Referring to FIGS. 1 and 2, a wafer 10 for subdivision into chips 12 includes an insulating base 14, usually silicon, carrying on its face 16 a large number of electronic components 18 such as circuits, transistors or other elements. The wafer 10 usually ranges in size from about 1½ inches to 5 inches in diameter and from about 8 to about 15 mils in thickness, depending on the diameter of the wafer 10. By way of example, a 3½ inch wafer 10 may be divided into from 5000 to 10,000 chips 12, each carrying an electronic component 18.

The wafer 10 produced in practice of the present invention carries on its back 20, opposite the electronic components 18, a stratified metal composite 22 in which successive strata of metals and/or alloys cooperate to enable successful attachment to a lead frame 24 of chips 12 divided from the wafer 10 and to insure satisfactory operation of the component 18 in the circuity of which it will be a part.

The metal and alloy strata are formed on the wafer back 20 by methods capable of forming thin uniform layers such as deposition from vapor state which will be referred to "evaporation", or by sputtering or electrolytic plating. The choice of method will depend on the metal or alloy to be deposited, but evaporation methods are preferred because the system is easier to control and allows more consistent duplication of results. The evaporation will be carried out under non-oxidizing conditions in a vacuum which may be, for example, about $5 \times 10^{-7}$ Torrs.

A series of successive strata of metals and/or alloys is deposited to form the metallized backing. The metals and/or alloys are chosen to perform various functions such as heat conduction; but at least one of the strata of the deposited metal will have the property of resisting the migration of copper toward the silicon base. Also it has been found useful for improving the union between strata to deposit an alloy of the two metals of adjoining strata onto the first metal strata and to deposit the second metal on the alloy. In the following description, the metal deposit is described as including only two metals in addition to the layer of solder, but additional metals and/or metal alloys may be deposited if desired.

The first metal deposited on the back of the layer is selected from those such as chromium and titanium, which are known to bond well to the silicon base and preferably in addition to resist migration through it of copper which may originate from the lead frame. Deposition is controlled to provide a thin stratum 26 of uniform thickness which may be as thin as 500 Å.

An alloy of the first metal and of a second metal such as silver or nickel known to have the ability to bond easily with tin or lead based solder and which may have other desired properties such as high heat conductivity and/or resistance to copper migration is a preferred second stratum 28. Various alloys of the two metals containing different relative amounts of the two may be used, but 50:50 alloys have been found generally satisfactory for providing a desirable union with a stratum of unalloyed second metal. This second stratum 28 is also deposited as a thin uniform layer preferably as thin as about 500 Å.

A third stratum 30 formed of the unalloyed second metal may be substantially thicker than the first two strata to take advantage of the special properties such as high heat conductivity of the metal. Thicknesses in the range of from about 5000 Å to about 10,000 Å have been found useful in this regard.

Additional metal or alloy layers (not shown) may be deposited on this third layer if desired prior to deposition of the solder stratum.

Surface strata of the metal composite on the back of the wafer are formed of a tin or lead base soft solder. A preferred solder composition will comprise tin or lead with antimony in the ratio of about 90 to 10. In a preferred procedure a stratum 32 of tin or lead is deposited on the surface of the previously deposited metal, antimony is deposited as a stratum 34 in an amount to provide the necessary percentage of antimony and thereafter a final stratum 36 of tin or lead is deposited on the antimony. The combined thickness of these solder strata is suitably from about 10,000 Å to about 50,000 Å.

Figure 3:
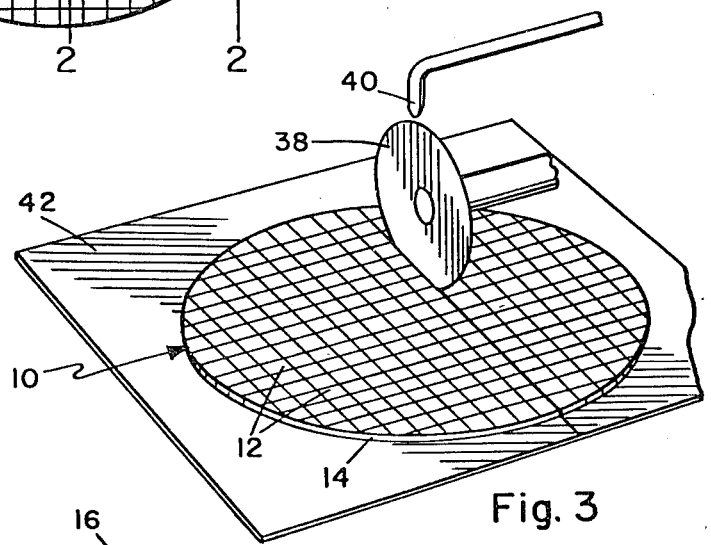
FIG. 3 is a perspective view showing the cutting of the wafer into individual chips.

The wafer 10 carrying the metal composite backing 22 is then cut up to form individual chips. Since the metal composite backing 22 is much thicker than previously used gold backing, it has been found desirable to effect this division as shown in FIG. 3 by means of an abrasive saw, such as a diamond saw 38 using deionized water supplied from conduit 40 as a cutting and cooling aid and cutting against and partially into an engineering plastic such as a sheet 42 of "Mylar" assembled tightly against the metallized backing 22.

Figure 4:
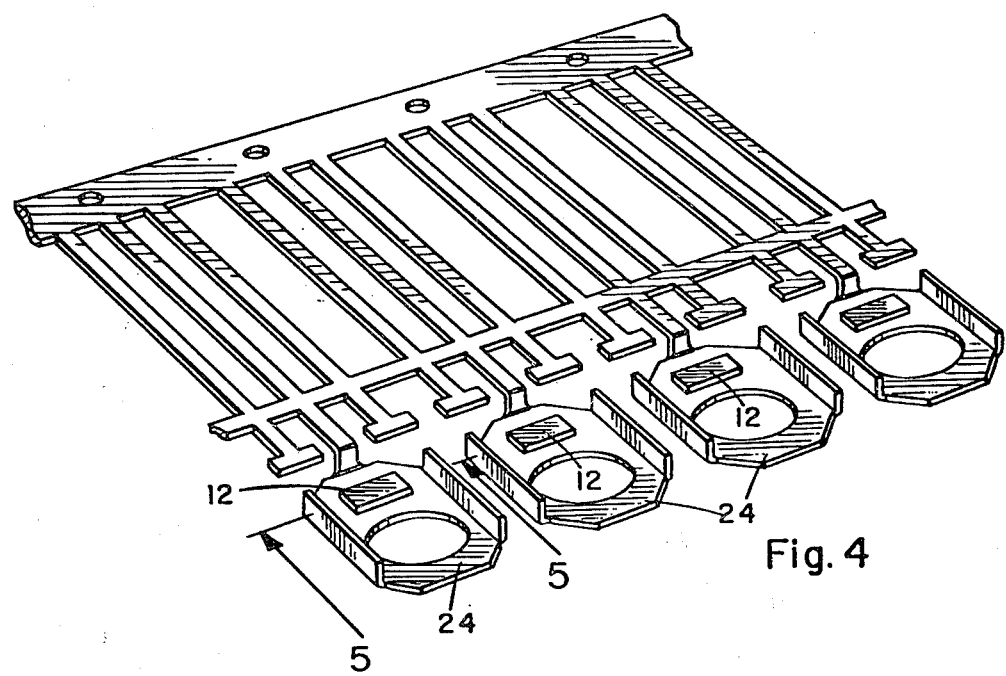
FIG. 4 is a perspective view showing the assembly of chips on a lead frame.
Figure 5:
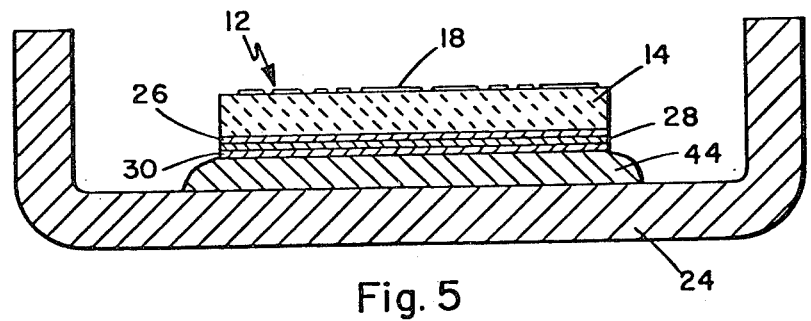
FIG. 5 is a sectional view taken on the line 5—5 of FIG. 4 with parts enlarged for purposes of clarity.

The individual chips 12 may be secured to a lead frame 24 of, for example, a copper or a copper alloy which may be plated with Nickel or with silvers by positioning the chips 12 in predetermined relation on the lead frame 24 as shown in FIG. 4 (melting the solder by) heating the assembly to, for example, 200° to 340° C. to melt the tin or lead and antimony strata 32, 34 and 36 to form a molten solder stratum 44 as shown in FIG. 5, and thereafter cooling the assembly. Chips 12 so attached have been found to be strongly attached over the entire metallized backing 22 and the joints have been freed from voids.

The following examples are given to aid in understanding the invention and it is to be understood that the invention is not limited to the particular materials, procedures or other details of the examples.

EXAMPLE 1

A series of metal strata was deposited by evaporation procedure at $5 \times 10^{-7}$ Torrs on the back of 3½ in. diameter, 10 mil thick having a fused silicon base and carrying many transistorized components on its face. These strata were a 500 Å stratum of chromium adhering directly to the wafer back, followed in order by a 500 Å stratum of a 50:50 alloy of chromium and silver, a 5000 Å stratum of silver, a 15,000 Å stratum of lead, a 3000 Å stratum of antimony and a 15,000 Å stratum of tin.

Following deposition of the metal, a sheet of Mylar was pressed firmly against the metal backing and the wafer was cut into individual chips using a diamond saw with deionized water as coolant, the cut extending into the Mylar sheet.

The chips were assembled in position on a silver coated copper lead frame and the assembly was heated to 200° to 240° C. After cooling the assembly the chips were found to be strongly adhered. Examination of the joints did not disclose any voids between the chips and the lead frame.

EXAMPLE 2

The following series of metal strata was deposited by evaporation procedure on the back of a 3½ inch diameter wafer, having a fused silicon base carrying many linear circuit components on its face. These strata were a 500 Å stratum of titanium adhering directly to the wafer back followed in order by a 500 Å stratum of a 50:50 alloy of titanium and nickel, a 5000 Å stratum of nickel, a 5000 Å stratum of silver, a 15,000 Å stratum of tin, a 3000 Å stratum of antimony and a 15,000 Å stratum of tin.

The wafer was divided into individual chips and adhered to a silver coated copper lead frame by the procedure of example 1. The chips were strongly adhered and the joints were free from voids.

Having described my invention, I claim:

1. A method for the manufacture of electronic chips for joining to a metallic lead frame comprising:
    depositing a first stratum of metal in strong adhering relation on the back of a fused silicon base wafer carrying a plurality of electronic circuit elements on its face;
    depositing a stratum of a second metal to which lead or tin based solder will readily adhere;
    depositing a stratum of an alloy of said first and second metals on the surface of said stratum of first metal, said stratum of second metal is deposited on the surface of said stratum of alloy in which the metal of said first stratum is chromium and said second metal is silver;
    depositing a stratum of lead or tin based solder on said stratum of said second metal;
    dividing said wafer into separate electronic chips with said strata adhering to their backs;
    at least one of said first and second metals being resistant to passage of copper atoms at soldering and operational temperatures;
    depositing metal having high heat conductivity as a stratum having a thickness to improve heat conductivity from said silicon base to a lead frame to which said chips may be joined; and
    said stratum of solder being of sufficient thickness to form a bond to said lead frame when a chip from said wafer is laid on said lead frame and subjected to heat to fuse said solder.

2. A method as defined in claim 1 in which said first stratum and said alloy stratum are each of the order of 500 Å in thickness, said silver stratum is from about 5000 Å to about 10,000 Å in thickness and deposition of said strata is effected by evaporation.

3. A method as defined in claim 2 in which second stratum is an alloy of equal parts of chromium and silver, and said stratum of solder is from about 10,000 Å to about 50,000 Å in thickness.

4. A method as defined in claim 3 in which formation of said stratum of solder includes the steps of:
- depositing a stratum of tin or lead on said silver stratum;
- depositing a stratum of antimony on said tin or lead stratum;
- depositing a stratum of tin or lead on said antimony stratum,
- the thickness of said tin or lead strata relative to said antimony stratum being selected to provide a predetermined ratio by weight of tin or lead to antimony.

5. A method for the manufacture of electronic chips as defined in claim 1 in which said wafer and associated metal strata is divided into chips by cutting with an abrasive saw.

6. A method for the manufacture of electronic chips for joining to a metallic lead frame comprising:
- depositing a first stratum of metal in strong adhering relation on the back of a fused silicon base wafer carrying a plurality of electronic circuit elements on its face;
- depositing a stratum of a second metal to which lead or tin based solder will readily adhere;
- depositing a stratum of an alloy of said first and second metals on the surface of said stratum of first metal, said stratum of second metal is deposited on the surface of said stratum of alloy in which the metal of said first stratum is titanium, and said second metal is nickel;
- depositing a stratum of lead or tin based solder on said stratum of said second metal;
- dividing said wafer into separate electronic chips with said strata adhering to their backs;
- at least one of said first and second metals being resistant to passage of copper atoms at soldering and operational temperatures; and
- said stratum of solder being of sufficient thickness to form a bond to said lead frame when a chip from said wafer is laid on said lead frame and subjected to heat to fuse said solder.

7. A method as defined in claim 6 in which said first stratum and said alloy stratum are each of the order of 500 Å in thickness, said nickel stratum is from about 5000 Å to about 10,000 Å in thickness and deposition of said strata is effected by evaporation.

8. A method as defined in claim 7 in which second stratum is an alloy of equal parts of titanium and nickel, and said stratum of solder is from about 10,000 Å to about 50,000 Å in thickness.

9. A method as defined in claim 8 in which formation of said stratum of solder includes the steps of:
- depositing a stratum of tin or lead stratum;
- depositing a stratum of antimony on said tin or lead stratum;
- depositing a stratum of tin or lead on said antimony stratum;
- the thickness of said tin or lead strata relative to said antimony stratum being selected to provide a predetermined ratio by weight of tin or lead to antimony.

10. A method for the manufacture of electronic chips as defined in claim 7 in which metal having high heat conductivity is deposited as a stratum having a thickness to improve heat conductivity from said silica base to a lead frame to which said chips may be joined.

11. A method for the manufacture of electronic chips for joining to a metallic lead frame comprising:
- depositing a first stratum of chromium in strong adhering relation on the back of a fused silicon base wafer carrying a plurality of electronic circuit elements on its face;
- depositing a stratum of silver to which lead or tin based solder will readily adhere;
- depositing a stratum of an alloy of said chromium and silver on the surface of said stratum of first metal, said stratum of silver metal is deposited on the surface of said stratum of alloy;
- depositing a stratum of lead or tin based solder on said stratum of silver;
- dividing said wafer into separate electronic chips with said strata adhering to their backs;
- at least one of said chromium and silver being resistant to passage of copper atoms at soldering and operational temperatures; and
- said stratum of solder being of sufficient thickness to form a bond to said lead frame when a chip from said wafer is laid on said lead frame and subjected to heat to fuse said solder.

* * * * *